(12) United States Patent
Nair et al.

(10) Patent No.: US 8,378,512 B2
(45) Date of Patent: Feb. 19, 2013

(54) WAVE ENERGY HARVESTER WITH IMPROVED PERFORMANCE

(75) Inventors: Balakrishnan Nair, Sandy, UT (US); Jesse Alan Nachlas, Salt Lake City, UT (US); Andrew Joseph Gill, Salt Lake City, UT (US); Zachary Murphree, Salt Lake City, UT (US)

(73) Assignee: Oscilla Power Inc., Salt Lake City, UT (US)

( * ) Notice: Subject to any disclaimer, the term of this patent is extended or adjusted under 35 U.S.C. 154(b) by 190 days.

(21) Appl. No.: 13/016,828

(22) Filed: Jan. 28, 2011

(65) Prior Publication Data

US 2012/0056432 A1 Mar. 8, 2012

Related U.S. Application Data

(60) Provisional application No. 61/300,438, filed on Feb. 1, 2010.

(51) Int. Cl.
*F03B 13/00* (2006.01)
(52) U.S. Cl. ............................................. 290/42; 290/53
(58) Field of Classification Search .................... 290/42, 290/53
See application file for complete search history.

(56) References Cited

U.S. PATENT DOCUMENTS

| | | | | |
|---|---|---|---|---|
| 6,791,205 B2* | 9/2004 | Woodbridge | ................... | 290/53 |
| 6,833,631 B2* | 12/2004 | Van Breems | ................... | 290/42 |
| 7,816,797 B2* | 10/2010 | Nair | ................... | 290/42 |
| 7,964,977 B2* | 6/2011 | Nair | ................... | 290/42 |
| 2005/0099010 A1* | 5/2005 | Hirsch | ................... | 290/42 |
| 2008/0168844 A1* | 7/2008 | Lequesne et al. | ................... | 73/779 |

* cited by examiner

*Primary Examiner* — Tho D Ta
(74) *Attorney, Agent, or Firm* — Jeffrey T. Holman

(57) ABSTRACT

An apparatus for harvesting electrical power from hydrodynamic energy, the apparatus including a buoy or other water flotation device connected to an anchor by a tether and a magnetostrictive component having an internal pre-stressed magnetostrictive core that experiences at least a part of load changes experienced by the tether. The magnetic property of the magnetostrictive core is configured to change with changes in stress within the magnetostrictive core along at least one direction within the magnetostrictive component. The hydrodynamic energy acting on the buoy or other water flotation device results in changes in force within the tether, which in turn changes the stress within the magnetostrictive core and consequently changes a magnetic property. The magnetostrictive component is also configured such that the change in the magnetic property will result in a change in magnetic flux, which change can be used to generate electrical power.

20 Claims, 8 Drawing Sheets

(a) Schematic of the proposed wave energy harvester showing multiple devices operating together (b) Schematic of a magnetostrictive component within each tether; each tether includes many components such as these joined together with chain links (a) Illustration of the change in dimensions of a magnetostrictive material under the influence of a magnetic field (b) Dependence of magnetostriction strain on the applied magnetic field Comparison of Magnetoelastic coupling of Fe-Al with Fe-Ga and Fe-Be as reported by Clark et al.

Magnetic and Magnetostrictive properties of Alfenol as reported by Davis and Ferabee Dependence of the Magnetic field (B) in Fe-18.4 At% Ga at various bias fields and compressive stresses; the black solid arrow indicates the direction of increasing bias magnetic fields Pre-compression loading fixture

WAVE ENERGY HARVESTER WITH IMPROVED PERFORMANCE

CROSS-REFERENCES TO RELATED APPLICATIONS

This application claims the benefit of U.S. Provisional Application No. 61/300,438, filed Feb. 1, 2010, and entitled "Wave Energy Harvester with Improved Performance" which is incorporated by reference herein in its entirety.

STATEMENT OF FEDERALLY SPONSORED RESEARCH

This invention was made with Government support under U.S. Grant No. WC133R10CN0220 awarded by National Oceanic and Atmospheric Administration. The Government has certain rights to this invention.

BACKGROUND

Wide deployment of renewable energy sources that are both commercially viable and environmentally benign unquestionably ranks as one of today's global grand challenges. Such technologies will not only fuel economic growth and contribute to global environmental sustainability, but also reduce our dependence on exhaustible fossil fuels in the coming decades. Ocean power remains a very high potential but under-utilized source for clean energy that would accomplish these objectives.

The Energy Information Administration estimates that global electricity consumption will increase from 18 to 32 trillion kWh between 2006 and 2030, reflecting an annual growth rate of 2.4%. Coal power is forecast to deliver 42% of this global increase, followed by renewables at 24% and natural gas at 23%, with nuclear power contributing the balance. U.S. electricity consumption will increase at a slower rate, climbing from 4.1 to 5.2 trillion kWh over this time period. Coal power is forecast to deliver 39% of this domestic increase, followed by renewables at 32% and natural gas at 18%. The bulk of the contribution from renewables is projected to come from new hydropower rather than less environmentally compromising renewables.

The identification and development of new cost-effective, energy-efficient and environmentally friendly power generation technologies will result in economic, health and security benefits to the US and global populations. Since clean energy generation is generally based on local resources, these technologies can help fuel the local economies of coastal areas through job creation and the availability of inexpensive energy to fuel local industries.

A high proportion of the market share growth in the clean energy sector will go to energy sources that have the capital efficiency, cost effectiveness, and resource availability to scale quickly over the next two decades. Conventional approaches to harvesting ocean energy have been delinquent across all three of these criteria—they are too capital intensive, have non-competitive energy costs, and require very specific ocean environments which limits the number of potential locations and thus the scale of impact. As such, conventional ocean energy systems are not considered to be in the same class as wind, solar photovoltaic, solar thermal, and geothermal when it comes to impact potential.

The cost of electricity from conventional devices is estimated to be 3-5 times that of coal power. Without radical departures from the conventional approach tried to date, it is plausible that ocean energy will never be a material part of the global energy mix.

SUMMARY

Embodiments of an apparatus are described. In one embodiment, the apparatus is an apparatus for harvesting electrical power from water mechanical energy, the apparatus including: a buoy or other water flotation device connected to an anchor by a tether and a magnetostrictive component having an internal pre-stressed magnetostrictive core that experiences at least a part of load changes experienced by the tether. The magnetic property of the magnetostrictive core is configured to change with changes in stress within the magnetostrictive core along at least one direction within the magnetostrictive component. The hydrodynamic energy acting on the buoy or other water flotation device results in changes in force within the tether, which in turn changes the stress within the magnetostrictive core and consequently changes a magnetic property. The magnetostrictive component is also configured such that the change in the magnetic property will result in a change in magnetic flux, which change can be used to generate electrical power. In one embodiment, the water flotation device is a buoy. In one embodiment, the magnetic property is a magnetic permeability of a magnetostrictive component. In one embodiment, the magnetic property is a magnetic flux density of a magnetostrictive component. In one embodiment, the electrically conductive coil is a polymer-coated electrically conductive coil surrounding the magnetostrictive component. Other embodiments of the apparatus are also described.

Embodiments of a method are also described. In one embodiment, the method is a method for harvesting electrical power from water mechanical energy. The method includes: tethering a water flotation device to an anchor by a tether, wherein the tether comprises a magnetostrictive component, the magnetostrictive component comprising a pre-stressed magnetostrictive core, wherein a magnetic property of the magnetostrictive core is configured to change with changes in stress within the magnetostrictive core along at least one direction within the magnetostrictive component. The method also includes using change in magnetic flux resulting from the change in magnetic property, the change in magnetic property resulting from applied force changes caused by the interaction of a wave environment with the water flotation device. The method also includes generating electrical power using the change in the magnetic flux. In one embodiment, the force changes caused by the interaction of a wave environment with the water flotation device are caused by caused by wave motion or wave height changes near the flotation device. Other embodiments of the method are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
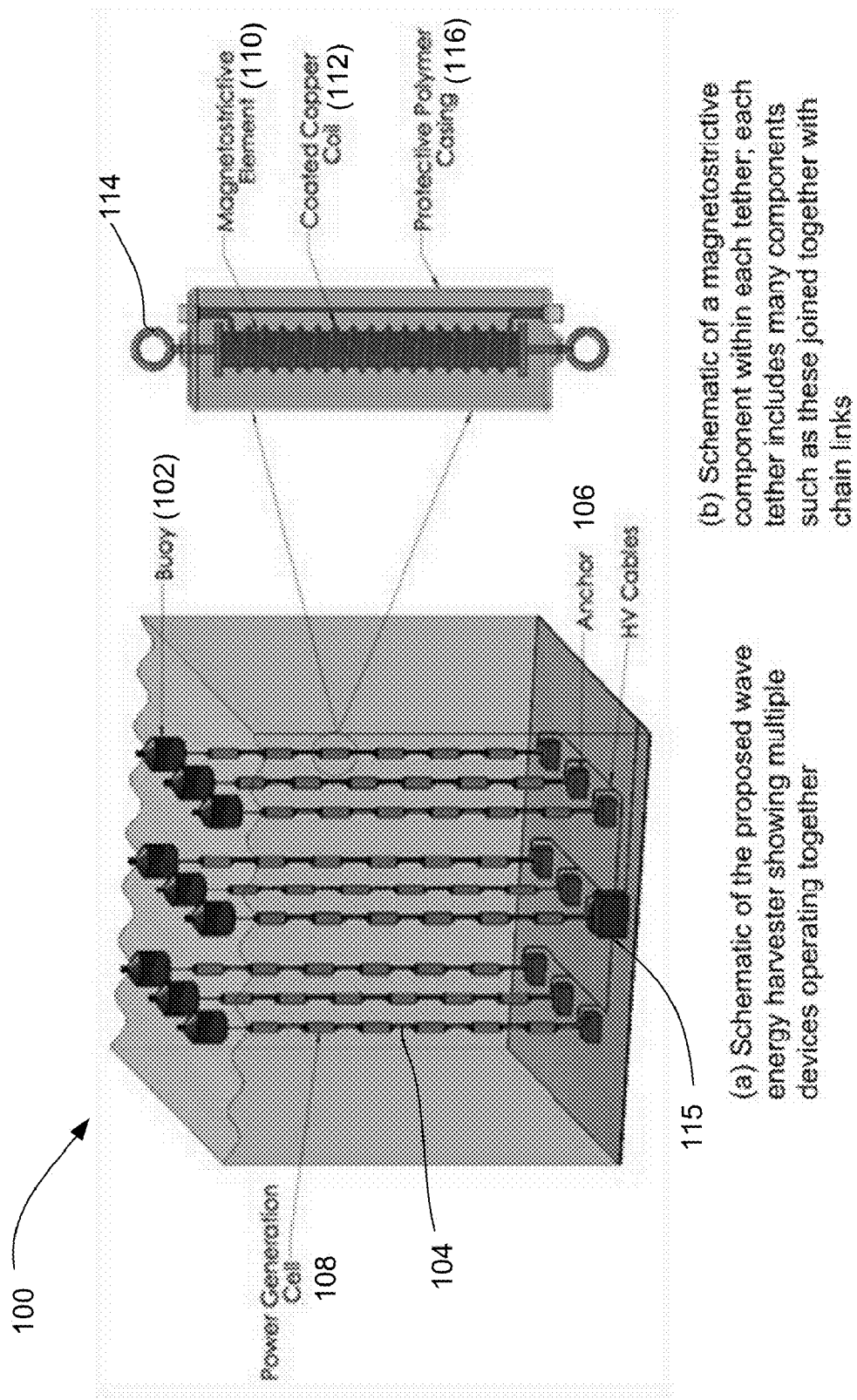
FIG. 1 depicts a schematic diagram of one embodiment of a wave energy harvester.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments describe a wave energy harvesting system utilizing magnetostrictive materials that can enable highly cost-efficient energy harvesting from ocean waves, or other wave environment, while providing extremely good durability and reliability. Embodiments also relate to a method and device for harvesting ocean wave energy that has the potential to deliver energy that is equal to or lower in cost than coal based power generation without subsidies or incentives. The method involves converting the mechanical energy of oscillating ocean waves into magnetic and then electrical energy using magnetostrictive materials. For the purposes of this description, a magnetostrictive material may be considered to be any material that can be designed or configured such that a change in applied stress can result in a change in the magnetic flux and/or magnetic field (the B-field) within the material. Another embodiment of the wave energy harvester ("WEH") may have a significant benefit on the ocean energy landscape due to its unique combination of low capital/maintenance costs, ruggedness and reliability relative to competing technologies and ability to function well in low to moderate wave-height locations. Furthermore, embodiments described herein include the first known ocean device that uses advanced materials as a substitute for moving parts, thereby minimizing one of the main engineering challenges in the ocean environment. While detailed power and cost modeling indicates that a device using magnetostrictive alloys such as iron-aluminum can be competitive with coal based power generation, significant improvement may be achieved by identifying and implementing specific design improvements that can increase the magnetic field change achieved within the material.

In one embodiment, the WEH is a device that captures the energy of oscillations in ocean waves and converts this energy to electrical energy. FIG. 1 depicts a schematic diagram of one embodiment of a WEH 100, which may include a plurality of WEH devices. Each WEH device includes a buoy 102 or other water flotation device attached to a tether 104 that is connected to an anchor on the sea floor as shown in FIG. 1(a). The tether 104, which is anchored to the seafloor using heavy weights and/or concrete (or other fastening mechanism) as anchors 106, may include one or more magnetostrictive components 108 (shown as "Power Generation Cells" in FIG. 1), which include magnetostrictive cores 110 (also referred to as magnetostrictive elements) having copper coils 112 around the cores 110 and connected to each other through chain links 114. The anchors 106 may be permanently fixed to the sea floor at a particular location in some embodiments. In one embodiment, the water flotation device is inside an oscillating water column.

A schematic of one embodiment of the magnetostrictive components 108 that make up the tether 104 is shown in FIG. 1(b). The magnetostrictive components 108 may include magnetostrictive cores 110 wound with polymer (e.g. Teflon, polytetrafluoroethylene) coated copper wire 112 to the desired number of turns as shown in FIG. 1(b). When a strain is imposed on magnetostrictive cores 110, it results in a change in a magnetic property of the magnetostrictive core 110. Such magnetic properties include the core's magnetization (or flux density) and the associated magnetic field (See FIG. 2). In one embodiment, the magnetostrictive elements are encased in structural casings 116 that are corrosion-resistant and water-tight, but allow for the majority of the tether load to be transferred to the magnetostrictive core 110 and also allow for water tight electrical connections. Each WEH device may be electrically connected to an electrical energy storage device 115. The electrical energy may be transformed or modified in any way, or may be transmitted to locations or devices.

Figure 2:
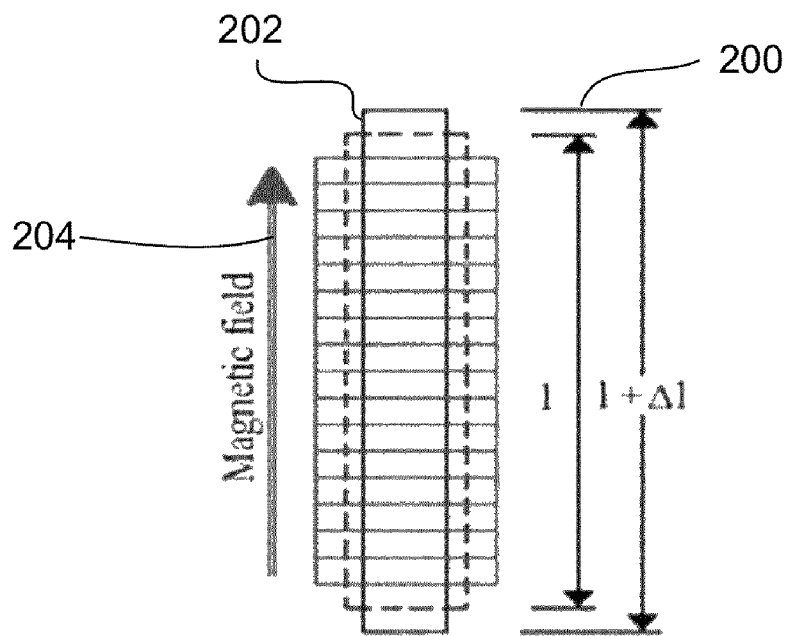
FIG. 2 depicts a schematic diagram of one embodiment of dimensions of a magnetostrictive material and a graph diagram of its associated magnetic field.
Figure 2:
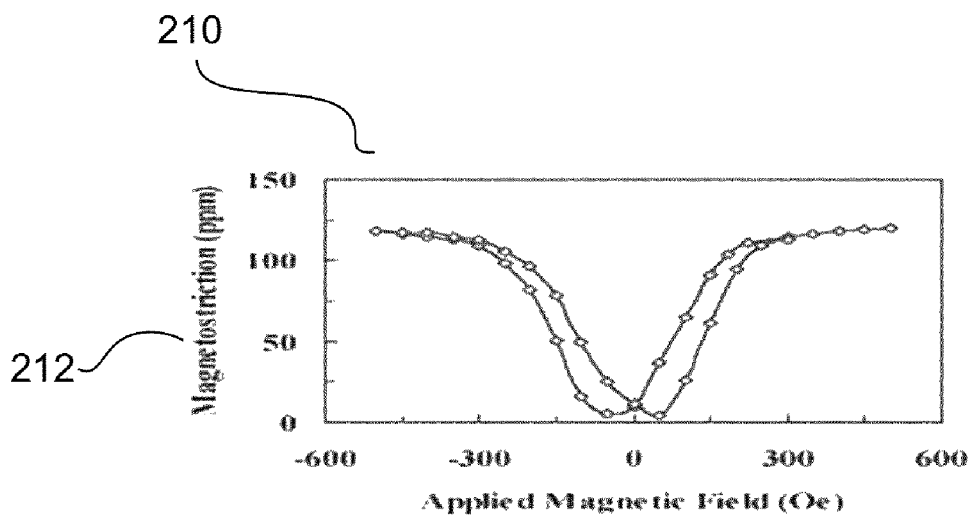

FIG. 2 depicts a schematic diagram of one embodiment of dimensions 200 of a magnetostrictive material and a graph diagram of its associated magnetic field, according to the strain on the device. FIG. 2(*a*) illustrates a range of dimensions 200 that a magnetostrictive material may experience when a magnetic field 204 is applied to the material 202. FIG. 2(*b*) is a graph 210 that illustrates a dependence of magnetostriction strain 212 on the applied magnetic field 204 of a particular magnetostrictive material.

In one embodiment, the WEH's buoys 102 are designed such that their vertical length exceeds the expected amplitude of oscillations of normal wave motion expected at the geographic location of interest. The WEH 100 may also be designed such that even as a wave is at its trough, the submerged height of the buoy is more than what it would have been if the buoy 102 was not tethered to the ocean floor. In this embodiment, the buoy 102 is always partially submerged whether it is at the crest or the trough of a wave. This ensures a tensile load on the magnetostrictive components 108 through the entire range of motion of the oscillating buoy 102. When a wave moves past a WEH buoy 102, the geometry outlined here causes the line tension in the tether 104 to be a strong function of the wave amplitude. When the passing wave is at its crest, more of the buoy 102 is submerged in water resulting in a greater tensile load on the magnetostrictive component 108. When the passing wave is at its trough, less of the buoy is submerged resulting in a lower tensile load on the magnetostrictive component 108. In order to optimize power production, the geometry of the individual magnetostrictive cores 110 is specified such that for a given buoy 102, the expected loads generated will result in strains that are below the saturation magnetostriction. As the wave oscillates past each buoy 102, the extension of the magnetostrictive element follows a similar oscillation, resulting in a constantly changing magnetic flux density along the length of the magnetostrictive element. This constantly changing magnetic flux density may be used to induce voltage/current in the copper coil 112.

One embodiment of the WEH 100 has at least three features that give it the potential to be a breakthrough in ocean power (although other embodiments may have less than all of the listed features):
1) Initial cost modeling indicates that energy cost as low as 2-4 cents/kWh is feasible based on reasonable assumptions using existing alloy materials. This compares with 10-20 cents/kWh projected from conventional approaches to ocean power.
2) The lack of any moving parts enables very high reliability and lifetime. A major weakness of many current and proposed ocean energy devices is their reliance on mechanical components such as gears, cranks, cams, pistons etc. In the ocean environment, corrosion or salt spray deposition can dramatically increase the friction and reduce the effectiveness of these components.
3) The technology will work well under conditions of low to moderate sustained winds (i.e., moderate wave heights) in addition to areas with high wave heights, making the technology complementary to off-shore wind systems that are optimal for areas of higher wind speeds and moderate wave heights.

The technology is clean and creates electricity from ocean waves without consuming any carbonaceous fuels or generating any harmful pollutants. Even compared with other technologies for harvesting ocean power, the lack of moving parts and joints that require lubrication that may leak and pollute the oceans, this technology is exceptionally clean and environmentally friendly. The substitution of the energy generated by these approaches over fossil fuels will reduce green house gases and pollutants without any undesirable side-effects or compromises. Finally, the technology is friendly to marine life as the structures will not result in any impediment to natural migration patterns or affect sea-life in any significant way.

Some embodiments may also be used in compression. In a compression configuration, the application of a compressive stress can reduce the magnetic flux in the orientation of the applied stress and the relieving of the compressive stress results in an increase in flux density.

The improvements outlined herein can further reduce WEH 100 system costs and increase system performance. Specifically, embodiments of the apparatus focus on improving the power density of low-cost magnetostrictive devices, through specific materials, component design and/or manufacturing enhancements, which can significantly reduce electricity costs.

Embodiments of the apparatus cover any device or method for harvesting or generating electric power that incorporates a magnetostrictive component 108, which includes a component containing a material whose magnetic properties change as a function of applied stress at least along one direction within the material. One embodiment covers any device or method for harvesting or generating electric power from the ocean that incorporates a magnetostrictive component 108, which includes a component containing a material whose magnetic properties change as a function of applied stress at least along one direction within the material. Another embodiment includes a device or method for causing a periodic change in stress/strain in the magnetostrictive component 108 by coupling it to a buoy 102. Magnetic properties include, but are not limited to, saturation magnetization, derivative of magnetization with respect to applied stress, magnetostrictive strain and magnetic permeability. This disclosure also covers processes, designs and materials that are intended to create states of pre-stress and/or pre-strain and/or magnetic bias within the magnetostrictive component. These states of pre-stress and/or pre-strain and or magnetic bias may either be created internal to the magnetostrictive material during materials processing, or be caused in the material by mechanically or magnetically coupling with secondary components.

Magnetostrictive materials have primarily been used for actuator applications, and so far most of the efforts by researchers who study magnetostriction tend to focus largely on this application. Since the primary objective of an actuator is to deliver displacement against a load, the key requirement for these applications is a high saturation magnetization. This need drove the development of new exotic materials such as terbium alloys (e.g. Terfenol-D) that had saturation magnetizations of up to 2000 ppm. However, the saturation magnetization strain is not a key parameter for energy harvesting applications. More important are parameters such as magneto-mechanical coupling coefficients (a measure of the energy that can be converted from magnetic energy to mechanical energy and vice versa), and the maximum magnetization change under applied tensile stress.

Figure 3:
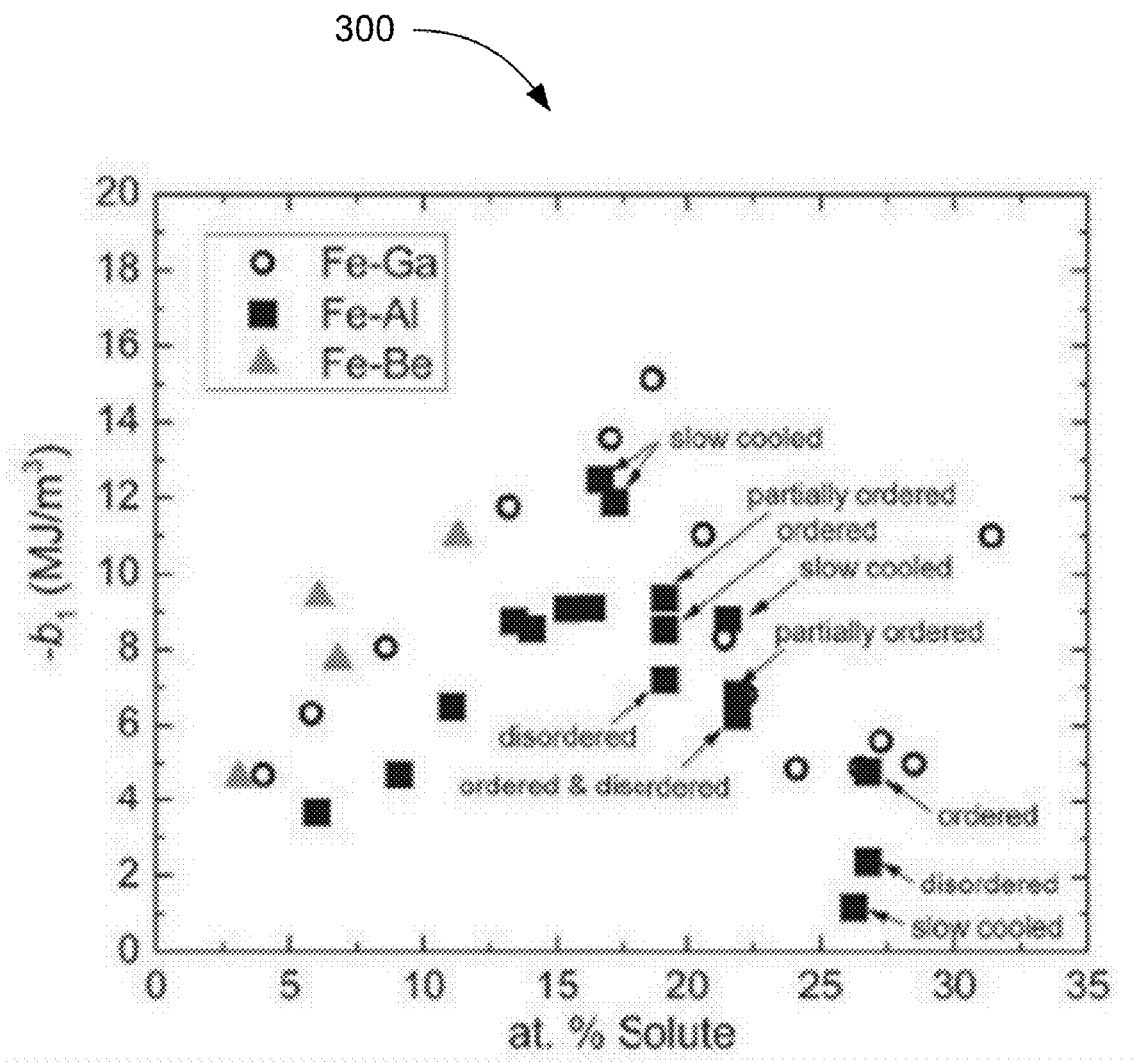
FIG. 3 depicts a graph diagram of one embodiment of a comparison of magneto-mechanical coupling coefficients for various magnetostrictive materials.
Figure 4:
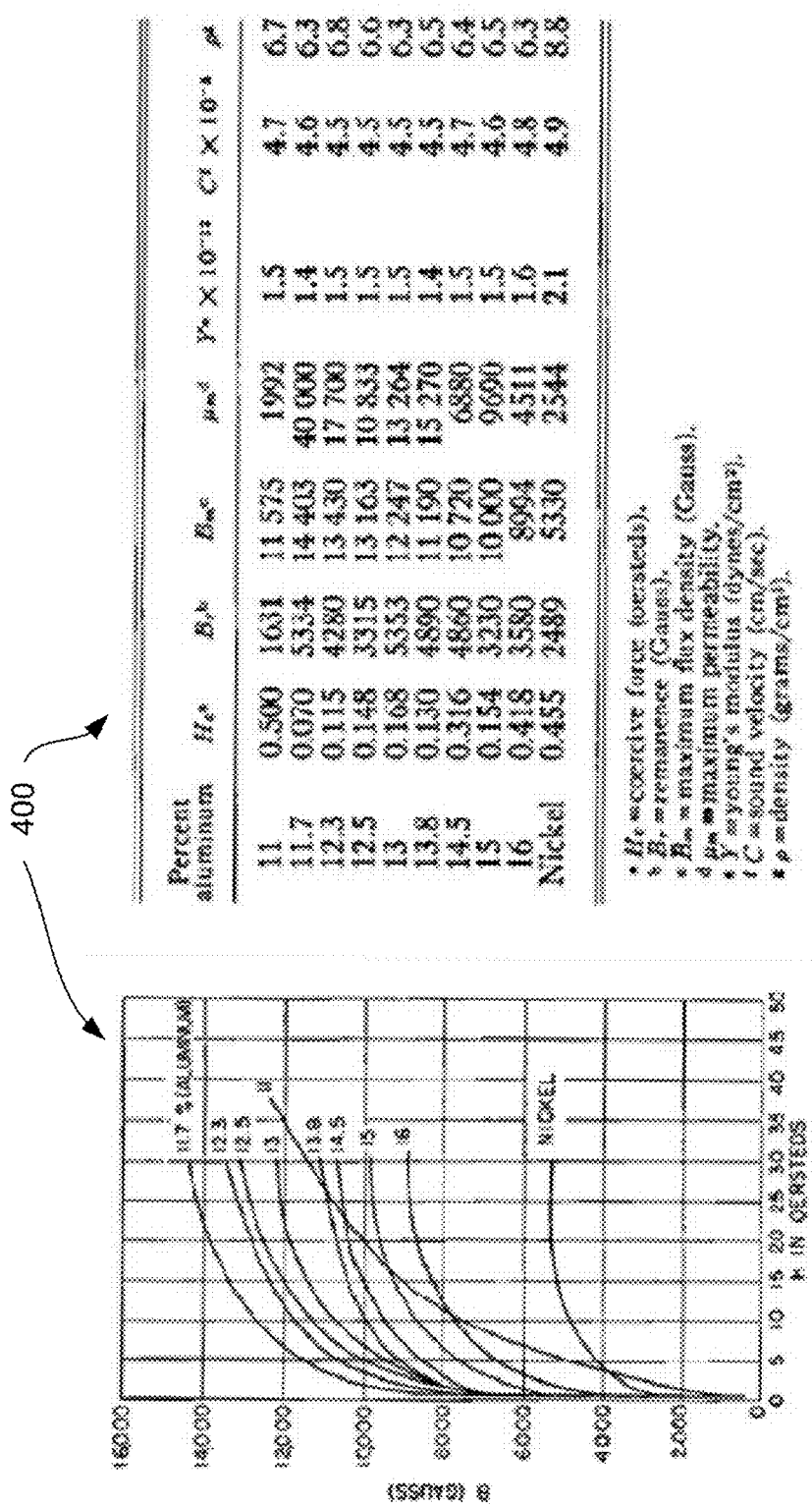
FIG. 4 depicts a graph diagram of one embodiment of magnetic and magnetostrictive properties of Alfenol.

In many embodiments, inexpensive "low performance" magnetostrictive materials such as iron aluminum alloys are more than sufficient to generate significant utility scale energy. Iron-aluminum alloys were first explored as magnetic alloys in the 1950s—while they have moderate saturation magnetostriction values (100-140 ppm), their magneto-mechanical coupling can approach that of iron-gallium and values as high as 13.7 Mega-Joules/m3 have been measured for Fe-16% Al (See FIG. 3). FIG. 3 depicts a graph diagram of one embodiment of a comparison 300 of magneto-mechanical coupling coefficients for various magnetostrictive materials. This is a measure of the maximum energy that can be converted from magnetic to mechanical and vice-versa in one stress/strain cycle. It may be desirable in some embodiments to increase the saturation magnetization of the alloys, and one method and device for improving the saturation magnetization is by appropriate alloy selection. Prior work done on iron-aluminum alloys indicates that saturation magnetization may be maximized between 11 and 13% aluminum (see FIG. 4). FIG. 4 depicts a graph diagram of one embodiment of magnetic and magnetostrictive properties 400 of Alfenol.

Possible criteria for material selection include the following:
1. For high energy efficiency, a high value for the derivative of the magnetization with respect to stress can be used. In other words, a small change in stress should result in a high change intensity of the magnetic field.
2. The material should possess low hysteresis in the strain-magnetization curve. The low hysteresis will result in low magnetomechanical coupling losses, again resulting in improved energy efficiency.
3. The material should have a high internal resistance. A high internal resistance of the alloy results in minimization of eddy currents within the magnetostrictive components and resulting heat generation/energy loss.
4. The material should be of very low cost (cents/kWh) and therefore exotic/rare and high-cost alloying elements may be avoided.
5. The material should be of low weight (cents/kg) to help reduce installation costs.

Gallium, terbium, or dysprosium doping may or may not be attractive for bulk applications where several tons of material will be needed for MW scale energy production. Alloying with trace elements such as Co, Mn, W and Mo to target three phase alloy compositions with small additions of these metals (under 20 atomic %, and preferably under 5 atomic %) into the Fe—Al system has shown promising improvements in various properties as indicated below:
Co—Cobalt alloying of Fe or Fe—Al may improve magnetomechanical coupling coefficient and magnetoelastic coupling (MJ/m$^3$).
Mn—Addition of Mn has been shown to increase the electrical resistivity of Fe—Ga alloys without significant magnetostriction deterioration. A higher electrical resistivity can help to minimize eddy current losses in the magnetostrictive material and increase energy efficiency.
Mo—Mo additions up to 4% in Fe—Al alloys have shown to reduce corrosion weight losses by an order of magnitude. Fe—Al—Mo alloys have been shown to be strong and ductile, while possessing magnetostrictive properties.
W—Fe—Al—W alloys have been shown to be strong and ductile, while possessing magnetostrictive properties.

There have been a few publications that have looked at vibration energy harvesting using magnetostrictive devices. These devices tend to be very small devices designed for MEMs systems that can generate under 1 Watt, again consistent with the common perception that magnetostrictive materials are expensive, and suitable only for niche low-power applications. However, while these devices were not pushed to determine the maximum power efficiency, this body of work has shown energy efficiency from mechanical to electrical energy of 60-80% in constant displacement mode over a wide range of frequency (0-2000 Hz) using magnetostrictive materials.

Figure 5:
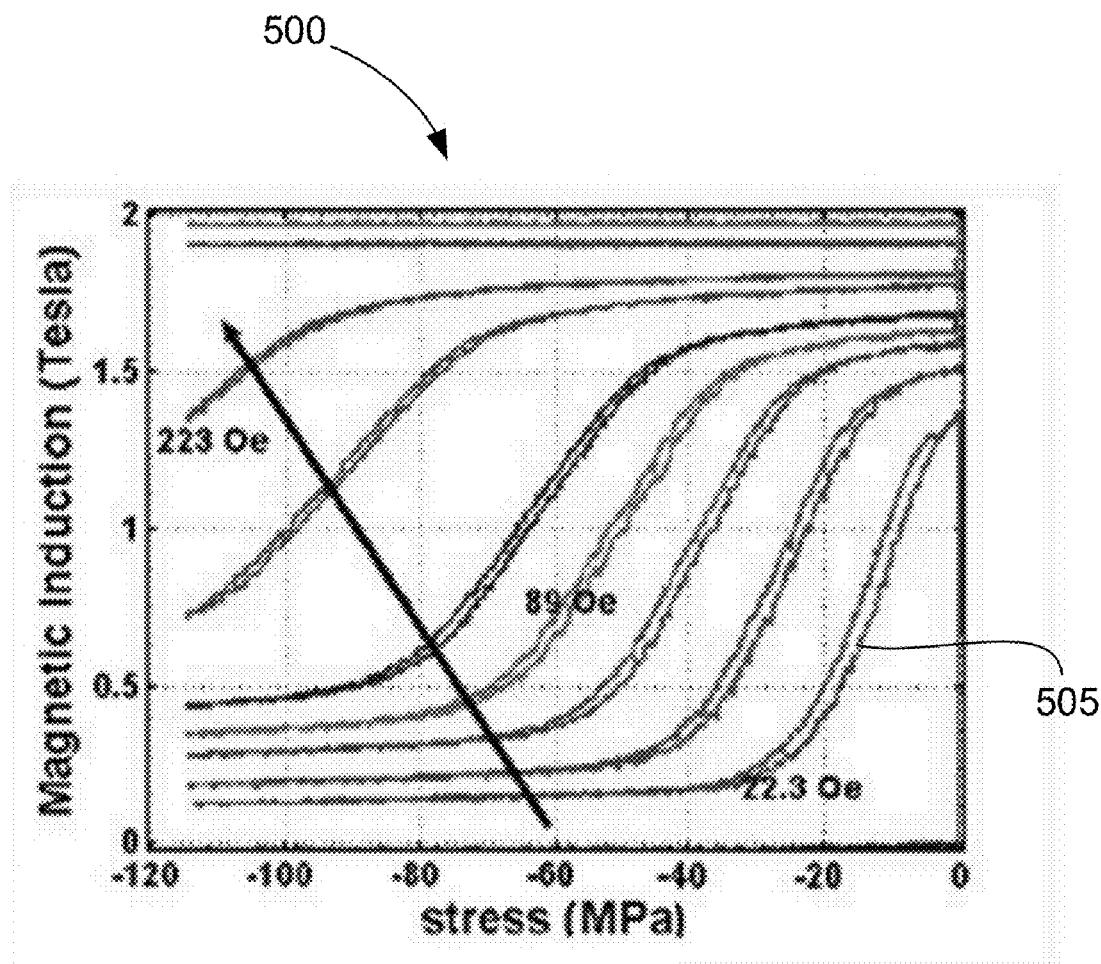
FIG. 5 depicts a graph diagram of one embodiment of an effect of bias magnetic fields and compressive stress on a magnetostrictive material.

FIG. 5 depicts a graph diagram of one embodiment of an effect 500 of bias magnetic fields and compressive stress on a magnetostrictive material. In magnetostrictive materials, the application of a compressive stress reduces its magnetic permeability in the direction of the applied compressive stress. Specifically, the application of a compressive pre-stress impacts the magnetic permeability, and therefore the magnetic flux density (B) within the alloy for a given applied magnetic field (h). This effect has been studied in great detail for new magnetostrictive materials such as iron-gallium (Fe—Ga) alloys, and the data is shown in FIG. 5. At higher compressive stress, a greater field is required to reorient the magnetic moments parallel to the axis of the sample. Thus, at larger compressive stresses, a higher bias magnetic field is required to reorient the magnetic moments parallel to the sample. Stated another way, at larger compressive stresses, a higher bias magnetic field is required to reach saturation magnetization. This phenomenon can be utilized to generate a significant change in magnetic permeability and therefore magnetic flux density within magnetostrictive materials with a change in tensile stress. For example, consider the curve 505 for the bias magnetic field of 22.3 Oe in FIG. 5. If the material has a pre-compressive stress of 30 MPa, the magnetic field within the material is around 0.3 Tesla. If we apply an incremental tensile stress of 30 MPa that essentially eliminates this compressive stress, the magnetic field within the material increases to around 1.4 Tesla, resulting in a change of over 1.1 Tesla of magnetic field for a tensile stress of 30 MPa.

Fe—Ga is very similar to Fe—Al, except in the fact that it has a greater magnetostrictive strain. Since the Fe—Al alloys were originally developed in the 1950s and largely ignored since then due to their relatively small magnetostrictive strains, very little is known about the interaction between pre-compressive stresses, bias magnetic fields and magnetic permeability. We do know from the available data that maximum saturation magnetization may be as large as 1.6 Tesla for Fe—Al alloys.

In some embodiments, methods and devices are included to incorporate magnetostrictive components with the appropriate combination of bias magnetic field and pre-stress that will provide the maximum change in the B-Field in specific magnetostrictive alloys into systems that are designed to generate electric power. In one embodiment, methods and devices are included to incorporate magnetostrictive components 108 with the appropriate combination of bias magnetic field and pre-stress that will provide the maximum change in the B-Field in specific magnetostrictive alloys into systems that are designed to generate electric power by harvesting energy from the ocean. For a specific alloy, magnetic measurements similar to that shown in FIG. 5 can help identify the appropriate combination of bias magnetic field and pre-stress which maximize the change in magnetic field as a function of external applied stress. In one embodiment, the pre-stress force may be a compressive stress, and the applied external stress may be a tensile stress. In one embodiment, the applied stress is periodic. In one embodiment, the applied stress is caused by changes in tether tension in a system with a tethered buoy 102. In one embodiment, the change in magnetic field is at least 0.1 Tesla, and preferably at least 0.5 Tesla. The specific magnetostrictive alloy composition used in no way limits the scope of the method or apparatus.

After identifying the appropriate combination of bias magnetic fields and pre-compressive stresses that achieve a desired B-Field change in the selected magnetostrictive alloy component, the next step is to incorporate this into a component design and to develop a manufacturing process that achieve these target values while minimizing component costs.

For achieving the bias magnetic field, at least one permanent magnet incorporated in the vicinity of the magnetostrictive element or component may be used. The magnet or magnets may be internal to or external to the magnetostrictive component. Embodiments described herein are not specific to the use of permanent magnets, and persons skilled in the art can envision various configurations of permanent magnets or electromagnets to be used for achieving the same or similar bias fields. One embodiment incorporates permanent magnets with the magnetostrictive elements. One embodiment incorporates magnetostrictive components that have one or more bores into which permanent magnets may be incorporated. Magnetic field modeling can be used to design low cost permanent magnet assemblies (based on small rare earth magnets that can achieve the bias fields using, for example, Vizimag 3.18 software. Vizimag software is an electromagnetic modeling simulator software for analysis and simulation of field lines and flux density. The software can be used to analyze fields due to rectangular, toroidal and curved magnets, solenoids and their interaction with user-defined magnetic regions. In some embodiments, a relatively uniform magnetic field of a particular strength is achieved, while reducing or minimizing the number/volume of permanent magnets needed to achieve this field.

In some embodiments, a process to assemble magnetostrictive cores 110 and/or components 108 into mechanical fixtures can be used to pre-stress the cores 110 or components 108. In these compression fixtures, strain sensors attached to the magnetostrictive components can be used to determine the stress/strain state of the component that is being loaded. Alternatively, in these compression fixtures, load cells can be used to determine the stress/strain state of the component that is being loaded. Magnetic field measurement systems such as Tesla Meters to determine the change in magnetic field under compression to determine both the appropriate strain/load conditions to achieve the desired magnetic domain orientation within the materials may be used in real-time during the manufacturing process.

Figure 6:
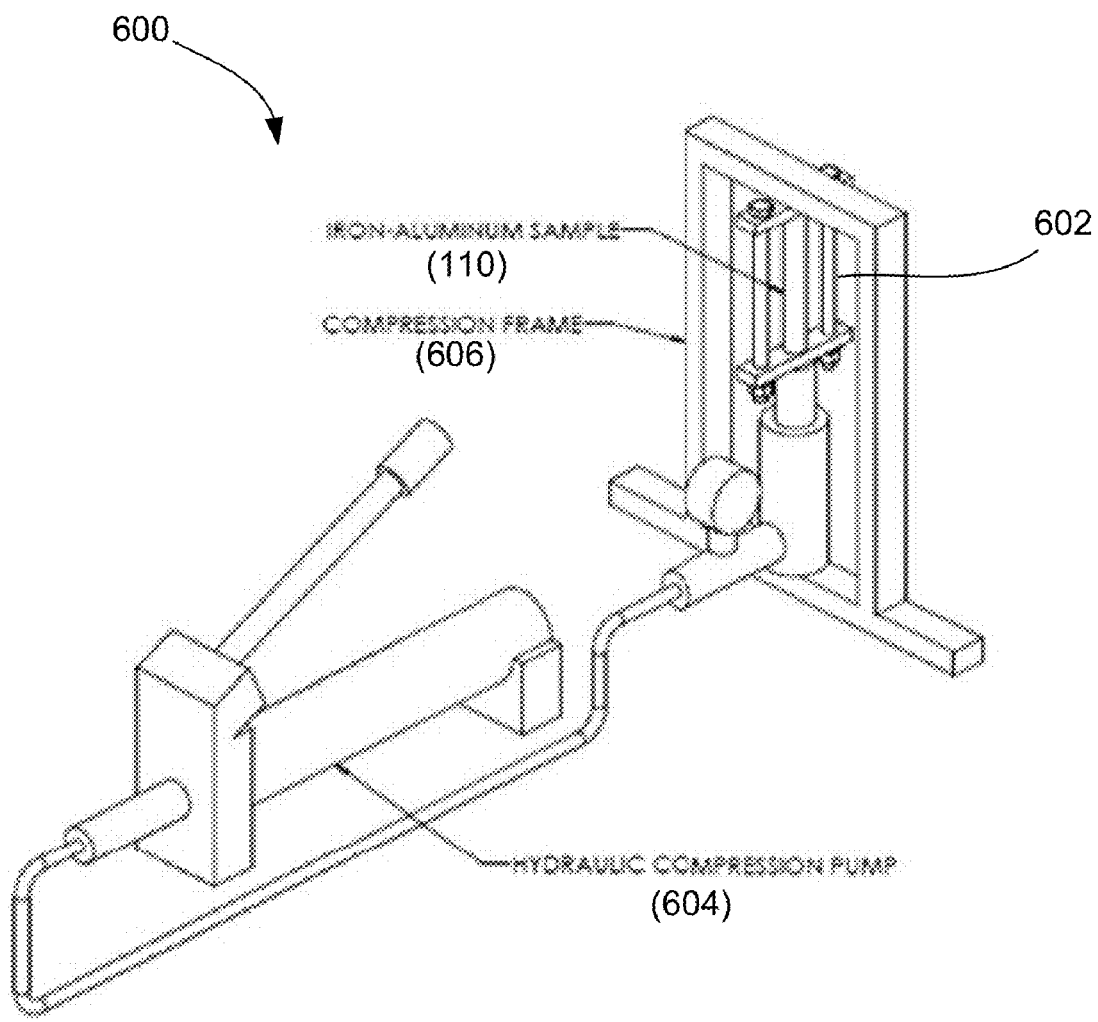
FIG. 6 depicts a schematic diagram of one embodiment of a pre-compression loading fixture.

FIG. 6 depicts a schematic diagram of one embodiment of a pre-compression loading system 600. One method of pre-stressing the magnetostrictive components includes putting the magnetostrictive alloy rod (or core 110) under a compressive load condition, in which the core 110 is installed in a fixture 602 that allows applying a compressive load using load application equipment such a hydraulic loading system 600 and the fixture 602 maintains the compressive load on the core 110 once it is removed from the loading system 600. The type and specific structure of the load application equipment does not limit the scope of the method or apparatus. If a hydraulic system 600 is used, it may include a simple hydraulic cylinder 604 and ram with a manual hand pump and an in-line pressure gauge. The fixture 602 may include two or more flat bars (or structural plates) of metal with holes drilled in them for threaded rods and nuts. The flat bars may or may not be made of a magnetically permeable alloy such as mild steel, or a relatively impermeable alloy such as stainless steel. The use of magnetically permeable flat bars may include additional bars to create a closed flux path. A sample alloy rod is installed in the fixture 602 with one or more flat bar on each end. The compression loading system 600 may include the manual hydraulic cylinder/ram 604 previously described plus an "H-Frame" 606 (or compression frame) that holds the fixture 602 while the compressive load is applied. Once the compressive load is applied to the rod/bar, the stainless steel threaded rod is passed through the holes in the flat bar and nuts are securely fastened on each end of the threaded rod. The nuts can be tightened down so that once the fixture 602 is removed from the compression loading system 600 the compressive force is maintained on the rod by the nut and bolt/s bar system. In one embodiment, strain gauges may be applied to the sample alloy rod when the process is first set up in order to ensure that the compressive force is maintained on the rod by the fixture 602 once it is removed from the loading system. The method of pre-stressing the magnetostrictive core may include using other mechanical structural components.

Figure 7:
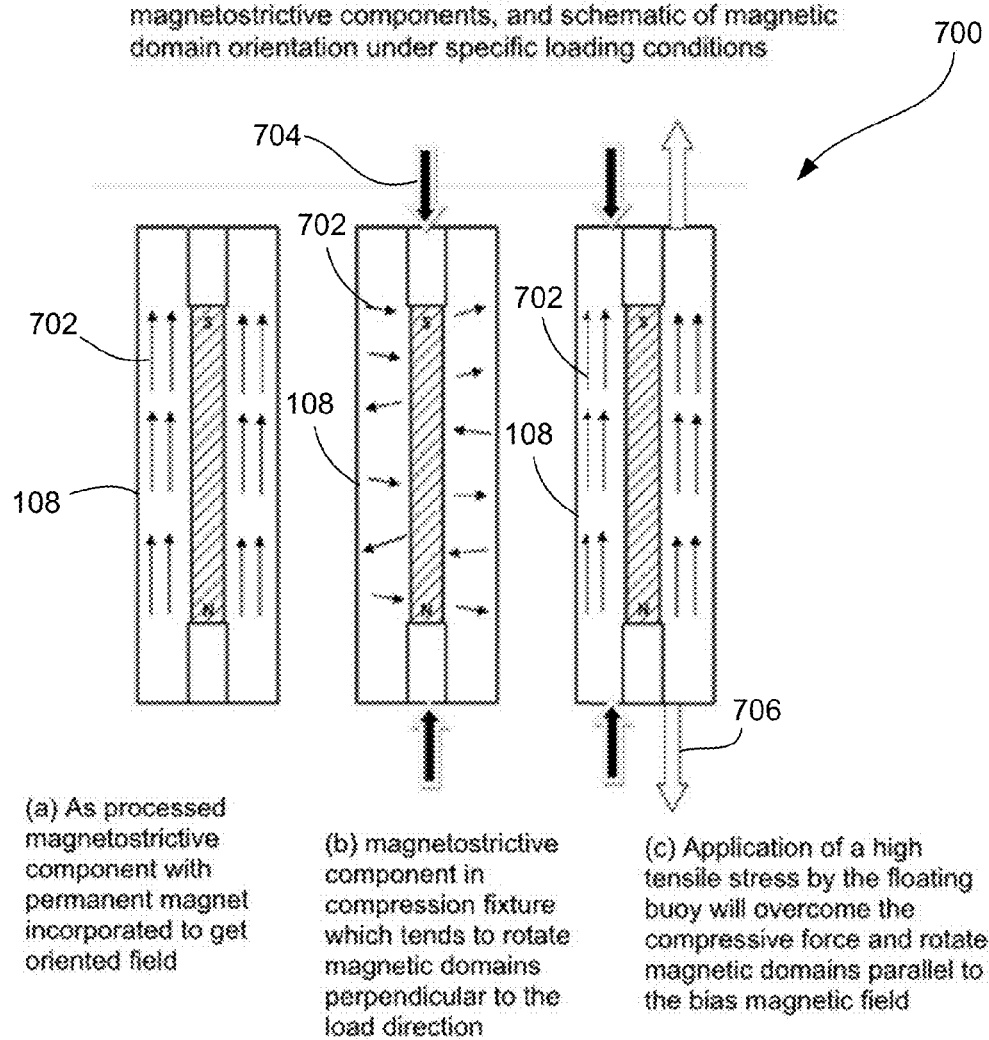
FIG. 7 depicts a schematic diagram of one embodiment of magnetic domain orientation in a magnetostrictive component under various stresses/magnetic field configurations.

FIG. 7 depicts a schematic diagram of one embodiment of magnetic domain orientation 700 in a magnetostrictive component 108 under various stresses/magnetic field configurations. Essentially, in the as-processed state, the magnetic domains 702 in the poly-crystalline alloy may be randomly oriented and have a net zero magnetic moment. By incorporating a permanent magnet to achieve a bias field 704, the domains 702 may be oriented to be parallel to the field 704. By applying a compression force on the magnetostrictive component 108 using a loading fixture 602, the magnetic domain orientations can be rotated away from the loading direction so as to be perpendicular to the loading direction. When a tensile force 706 is applied, such as by the buoy 102, the load in the magnetostrictive component 108 changes from compressive to zero or slightly tensile resulting in a complete rotation of the magnetic domains 702 and a very high efficiency of energy conversion.

The pre-stress and/or bias magnetic fields 704 (or magnetic domain orientations 702) may be incorporated into the magnetostrictive elements 110/components 108 during processing. The scope of the method or apparatus is not limited by the specific method of incorporation of pre-stress and/or bias magnetic fields 704 (or magnetic domain orientations 702) in the magnetostrictive element 108 during processing. Examples of methods that may be used include, but are not limited to, one or more of the following:
1. Quenching after processing
2. Quenching after annealing.
3. Single crystal processing
4. Grain orientation by mechanical processes such as rolling and extrusion.
5. Annealing under magnetic fields
6. Melt solidification under magnetic fields.
7. Powder compaction followed by sintering under magnetic fields.
8. Incorporation of magnetic second phases to orient the magnetic domains.
9. Incorporation of trace elements.
10. Incorporation of second phases or coatings that can result in residual stresses in the material.

Figure 8:
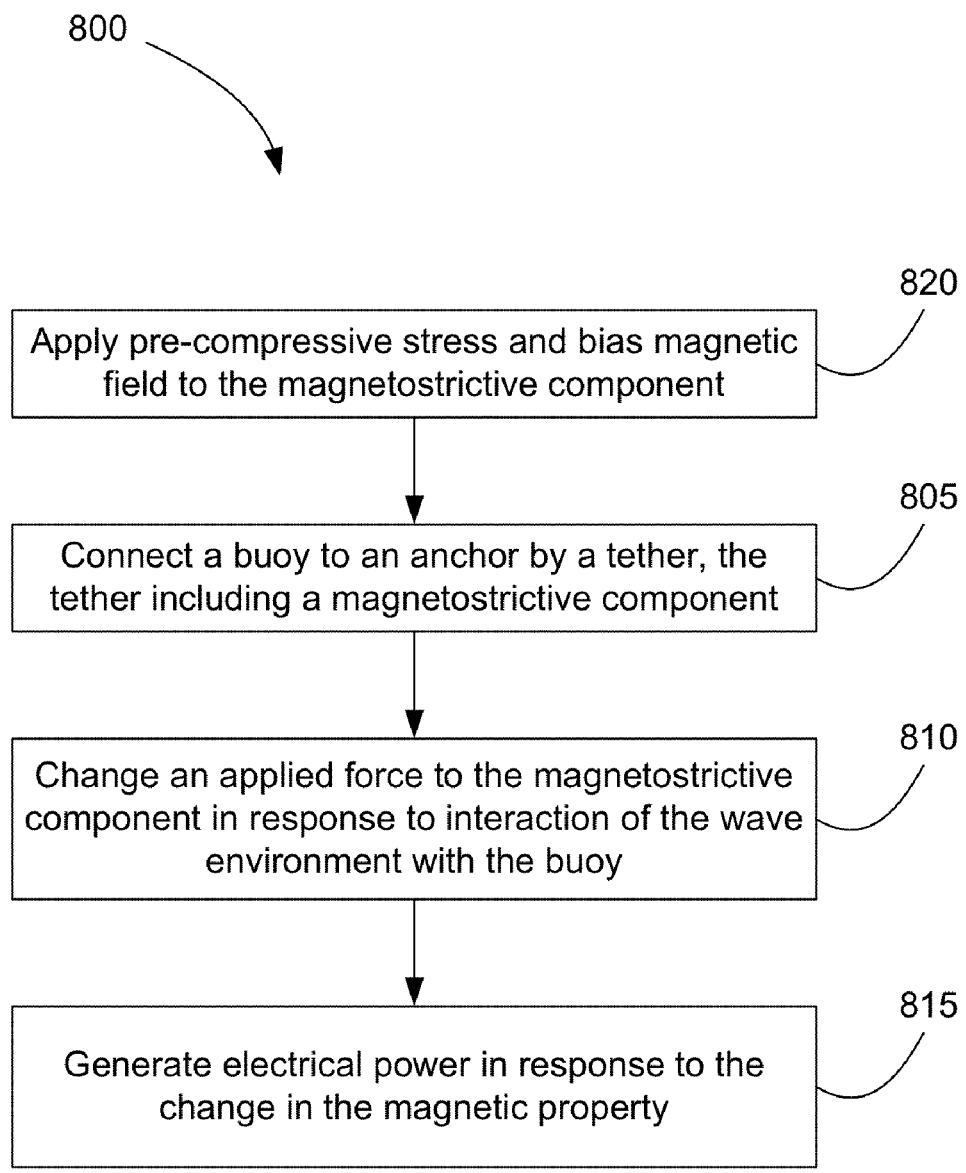
FIG. 8 depicts a flow diagram of a method for harvesting electrical power from water mechanical energy.

FIG. 8 depicts a flow chart diagram of one embodiment of a method 800 for harvesting electrical power from water mechanical, or hydrodynamic, energy. Although the method 800 is described in conjunction with the WEH 100 of FIG. 1, embodiments of the method 800 may be implemented with other types of wave or water mechanical energy harvesters.

The method 800 includes tethering 805 a water flotation device 102 to an anchor 106 by a tether 104, wherein the tether 104 includes at least one magnetostrictive component 108. A magnetic property of the magnetostrictive component 108 is configured to change upon an applied force to the magnetostrictive component 108 along a direction within the magnetostrictive component 108. In one embodiment, the applied force is a tensile force applied to the magnetostrictive core 110 of the component 108. Other embodiments may apply a compressive force.

The WEH 100 uses 810 the movement of the water flotation device 102, or buoyancy force, caused by motion of waves, wave height changes, or otherwise in conjunction with the force from the anchor 106 to create the applied force 706 and changes the magnetic property of the magnetostrictive component 108. Specifically, the applied force 706 changes a magnetic property of the magnetostrictive core 110 of the component 108. Because the applied force 706 changes the magnetic property of the component 108, the WEH 100 is able to create 815 electrical power using the change. In one embodiment, the WEH generates 815 electrical power by inducing a current or voltage in an insulated electrically conductive coil 112 magnetically coupled, wound around, or otherwise coupled to the magnetostrictive core 110 of the component 108. The coil 112 may be in electrical communication with an electrical energy storage device 115.

In one embodiment, an initial bias magnetic field 704 is applied 820 to the magnetostrictive component 108, such that the initial bias 704 results in some magnetic flux density within the magnetostrictive component 108. The bias 704 may be a magnetic bias created by permanent magnets proximate the core 110. A physical pre-stress force may be applied to the component 108 before connecting the tether to each of the buoy 102 or the anchor 106. In one embodiment, the bias magnetic field is directed through the magnetostrictive core through the use of one or more flux paths comprising magnetically permeable material. In one embodiment, both a physical pre-stress force and an initial bias magnetic field must be present in the magnetostrictive component 108 in order to generate power.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An apparatus for harvesting electrical power from hydrodynamic energy, the apparatus comprising:
    a buoy or other water flotation device connected to an anchor by a tether; and
    a magnetostrictive component having an internal pre-stressed magnetostrictive core that experiences at least a part of load changes experienced by the tether,
    wherein a magnetic property of the magnetostrictive core is configured to change with changes in stress within the magnetostrictive core along at least one direction within the magnetostrictive component,
    wherein hydrodynamic energy acting on the buoy or other water flotation device results in changes in force within the tether, which in turn changes the stress within the magnetostrictive core and consequently changes a magnetic property,
    wherein the magnetostrictive component is also configured such that the change in the magnetic property will result in a change in magnetic flux, which change can be used to generate electrical power.

2. The apparatus of claim 1, wherein the magnetic property is magnetic permeability.

3. The apparatus of claim 1, wherein the magnetostrictive core is magnetically coupled with an electrically conducting coil, wherein changes in magnetic flux within the magnetostrictive core results in electrical energy generation in the electrically conducting coil.

4. The apparatus of claim 1, wherein the magnetostrictive component comprises a corrosion-resistant, water-tight casing.

5. The apparatus of claim 1, wherein the force is a tensile force.

6. The apparatus of claim 1, wherein the pre-stressed magnetostrictive core is pre-stressed in compression.

7. The apparatus of claim 1, wherein the pre-stressed magnetostrictive core is pre-stressed using other mechanical structural components.

8. The apparatus of claim 1, wherein the pre-stressed magnetostrictive core is pre-stressed using structural plates that are tightened down onto the magnetostrictive core using threaded rods.

9. The apparatus of claim 1, wherein the pre-stressed magnetostrictive core has a bias magnetic field applied to it through the use of one or more magnets.

10. The apparatus of claim 9, wherein one or more of the magnets is a permanent magnet.

11. The apparatus of claim 9, wherein the bias magnetic field is directed through the magnetostrictive core through the use of one or more flux paths comprising magnetically permeable material.

12. A method for harvesting electrical power from water mechanical energy, the method comprising:
    tethering a water flotation device to an anchor by a tether, wherein the tether comprises a magnetostrictive component, the magnetostrictive component comprising a pre-stressed magnetostrictive core, wherein a magnetic property of the magnetostrictive core is configured to change with changes in stress within the magnetostrictive core along at least one direction within the magnetostrictive component;
    using change in magnetic flux resulting from the change in magnetic property, the change in magnetic property resulting from applied force changes caused by the interaction of a wave environment with the water flotation device; and
    generating electrical power using the change in the magnetic flux.

13. The method of claim 12, wherein creating electrical power comprises producing an electrical current in an electrically conductive coil magnetically coupled to the magnetostrictive core of the magnetostrictive component.

14. The method of claim 12, wherein the applied force is a tensile force.

15. The method of claim 12, wherein the pre-stressed magnetostrictive core is pre-stressed in compression.

16. The method of claim 12, further comprising pre-stressing the magnetostrictive core using other mechanical structural components.

17. The method of claim 12, wherein the pre-stressed magnetostrictive core is pre-stressed using structural plates that are tightened down onto the magnetostrictive core using threaded rods.

18. The method of claim 12, wherein the pre-stressed magnetostrictive core may have a bias magnetic field applied to it through the use of one or more magnets.

19. The method of claim 18, wherein one or more of the magnets is a permanent magnet.

20. The method of claim 18, wherein the bias magnetic field is directed through the magnetostrictive core through the use of one or more flux paths comprising magnetically permeable material.

* * * * *